(12) United States Patent
Furumiya et al.

(10) Patent No.: US 8,357,990 B2
(45) Date of Patent: Jan. 22, 2013

(54) SEMICONDUCTOR DEVICE

(75) Inventors: Masayuki Furumiya, Kanagawa (JP);
Hiroaki Ohkubo, Kanagawa (JP);
Yasutaka Nakashiba, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 753 days.

(21) Appl. No.: 12/458,139

(22) Filed: Jul. 1, 2009

(65) Prior Publication Data
US 2010/0025816 A1    Feb. 4, 2010

(30) Foreign Application Priority Data
Jul. 29, 2008   (JP) ................................. 2008-194929

(51) Int. Cl.
*H01L 29/00* (2006.01)
(52) U.S. Cl. . 257/516; 257/503; 257/547; 257/E29.006; 257/E29.024
(58) Field of Classification Search .................. 257/503, 257/506, 509, 516, 546, 547, E29.005, E29.006, 257/E29.024
See application file for complete search history.

(56) References Cited

U.S. PATENT DOCUMENTS

| 6,541,840 B1 * | 4/2003 | Terayama et al. ............. 257/516 |
| 2004/0108520 A1 | 6/2004 | Furumiya et al. |
| 2008/0265372 A1 | 10/2008 | Furumiya et al. |

FOREIGN PATENT DOCUMENTS

| JP | 2001-36015 | 2/2001 |
| JP | 2004-146613 | 5/2004 |

* cited by examiner

*Primary Examiner* — Matthew E Warren
(74) *Attorney, Agent, or Firm* — McGinn IP Law Group, PLLC (57) ABSTRACT

A width of a region where each of the N wells is in contact with the buried P well is not more than 2 μm. A ground voltage and a power supply voltage are applied to the P well and the N well, respectively. A decoupling capacitor is formed between the N well and the buried P well.

28 Claims, 7 Drawing Sheets

SEMICONDUCTOR DEVICE

This application is based on Japanese patent application NO. 2008-194929, the content of which is incorporated hereinto by reference.

BACKGROUND

1. Technical Field

The present invention relates to a semiconductor device.

2. Related Art

In recent years, an operating frequency of a semiconductor integrated circuit device is extremely increasing. When the semiconductor integrated circuit device is operated at a high frequency, a fluctuation in power supply voltage such as temporary current spike easily occurs. In an integrated circuit including a plurality of circuits, noise is propagated between circuits, and the circuit may erroneously operate. In a conventional art, a technique in which a decoupling capacitor is connected in parallel to a power supply in order to suppress a fluctuation in power supply voltage is known. In this manner, a power supply noise can be reduced to make it possible to suppress the fluctuation in power supply voltage, and a semiconductor integrated circuit device can be prevented from being erroneously operated by power supply noise and the fluctuation in power supply voltage. In order to achieve the object, the decoupling capacitor which is arranged due to the fluctuation in power supply voltage must have a capacitance of about several ten nano-farads with respect to one chip or package. However, when the decoupling capacitor as described above is arranged, a mounting area increases, and a degree of integration disadvantageously reduces.

In Japanese Patent Application Laid-Open No. 2001-36015, a technique is described in which; a bottom N well is formed on a p-type silicon substrate, an N well and a P well which are adjacent to each other are formed thereon, a voltage Vcc is applied to an N-diffusion region, a ground voltage GND is applied to a P-diffusion region, and a capacitor between the power supply voltage Vcc and the ground voltage Vss is formed on the contact surface between the N well and P well, and between the P well and the bottom N well. In this manner, problems such as necessity of a region and an interconnect required for a capacitor and a reduction in effective area in which a device can be arranged can be solved.

In Japanese Patent Application Laid-Open No. 2004-146613, a configuration is described in which a rear surface of a substrate is connected to a power supply terminal, and a pn junction is formed between the substrate and an inverse-conductivity-type epitaxial layer formed thereon to form a capacitor. In this manner, a semiconductor integrated circuit device which does not need a special arrangement region for arranging a decoupling capacitor, and easily manufactured is provided.

Figure 7:
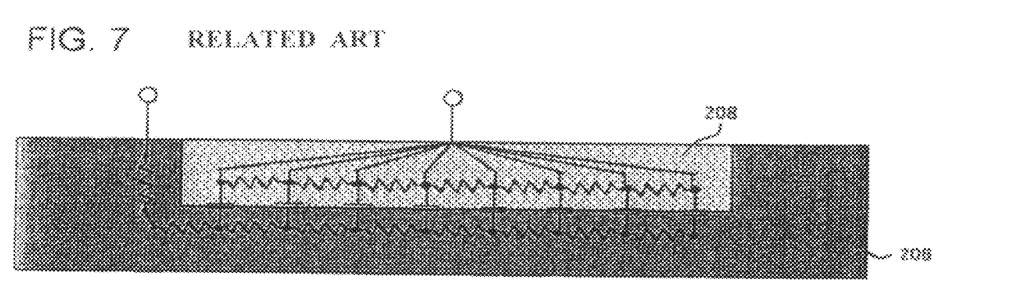
FIG. 7 is a sectional view showing a state in which the N well and the P well of the semiconductor device form a decoupling capacitor therebetween when the N well is large in width.

However, the present inventors have found that, in the configuration described in Japanese Patent Application Laid-Open No. 2001-36015, frequency characteristics of the decoupling capacitor are deteriorated when a well size is not appropriately set in formation of the decoupling capacitor. FIG. 7 is a sectional view showing a configuration in which an N well 208 is formed in a P well 206. In this configuration, a capacitor component is formed on a contact surface between a bottom surface of the N well 208 and the P well 206, and the capacitor component functions as a decoupling capacitor. However, when the N well 208 increases in width, although the capacitor component at a circumference portion of the N well 208 is applicable to a high frequency, a high resistance is applied to the capacitor component at a central portion of the N well 208. For this reason, when a frequency applied to the semiconductor device increases, with reference to an impedance of a decoupling capacitor configured by the N well 208 and the P well 206, a parasitic resistance caused by a resistance of the N well 208 cannot be neglected, and the decoupling capacitor does not function as a capacitor.

SUMMARY

In one embodiment, there is provided a semiconductor device including: a substrate; a buried well of a first conductivity type formed on the substrate; and a plurality of wells of the first conductivity type and a plurality of wells of a second conductivity type which are formed on the buried well of the first conductivity type and alternatively arranged adjacent to each other, wherein a width of a region where each of the wells of the second conductivity type is in contact with the buried well of the first conductivity type is not more than 2 µm, a ground voltage and a power supply voltage are applied to the wells of the first conductivity type and the wells of the second conductivity type, respectively, and a decoupling capacitor is formed between the wells of the second conductivity type and the buried well of the first conductivity type.

With the configuration described above, a resistance between the wells of the second conductivity type and the buried well of the first conductivity type may be reduced over an entire surface of the wells of the second conductivity type. Therefore, even though a frequency becomes high, influence of a parasitic resistor caused by a resistance on an impedance of the decoupling capacitor may be reduced, and a capacitor which is applicable to a high frequency applied to the semiconductor device can be obtained.

An embodiment obtained by converting an arbitrary combination of the above constituent elements and the expression of the present invention is effective as an embodiment of the present invention.

According to the present invention, when a decoupling capacitor is formed between the buried well of the first conductivity type and the wells of the second conductivity type formed on the substrate, the capacitor which is applicable to a high frequency can be obtained.

BRIEF DESCRIPTION OF THE DRAWINGS

The above and other objects, advantages and features of the patent invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention will be described below with reference to the accompanying drawings. In all the drawings, the same reference symbols denote the same configuration elements, and a description thereof is not repeated accordingly.

In the following embodiment, a first conductivity type is a P type, and a second conductivity type is an N type. These combinations may be reversed in another embodiment.

Figure 1:
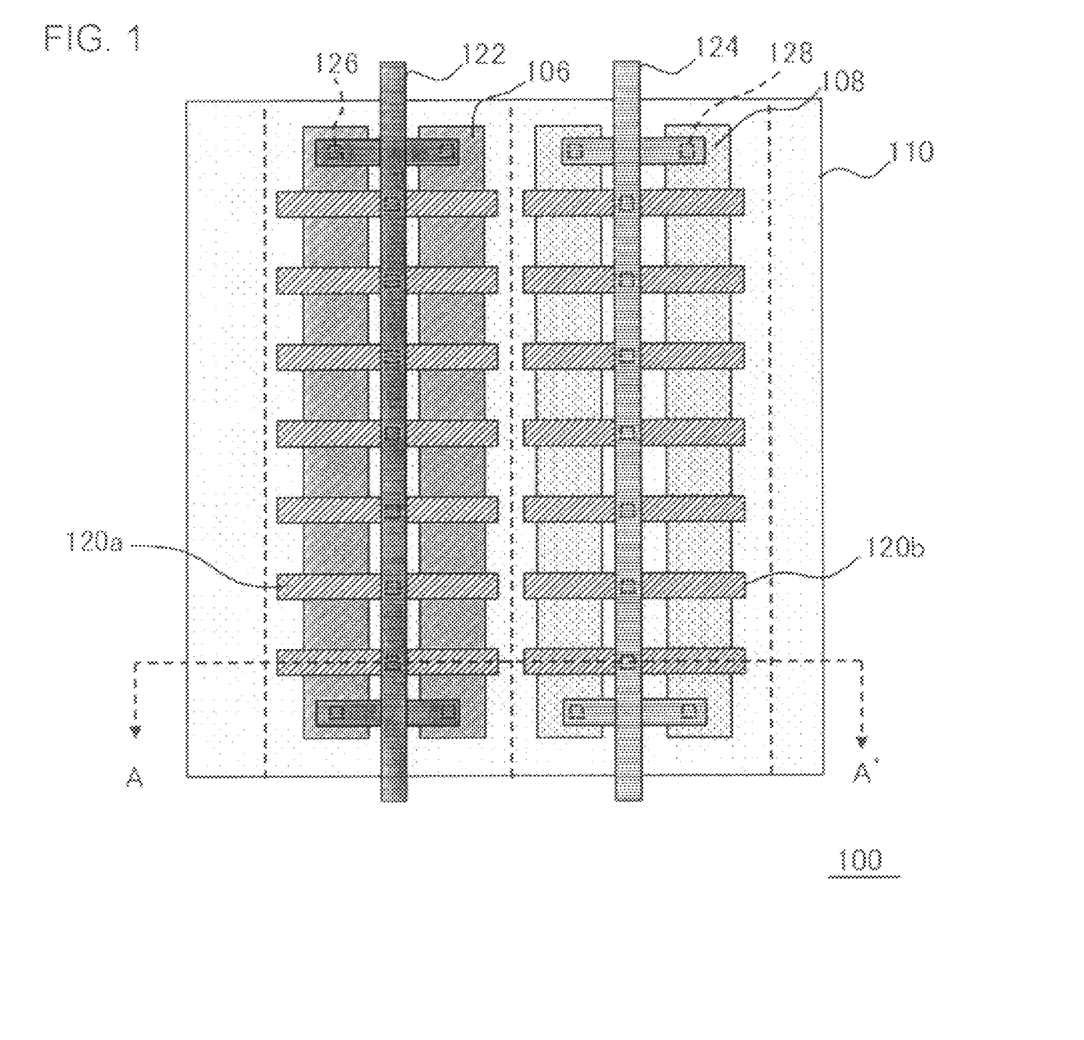
FIG. 1 is a plan view showing a configuration of a semiconductor device according to an embodiment of the present invention.
Figure 2:
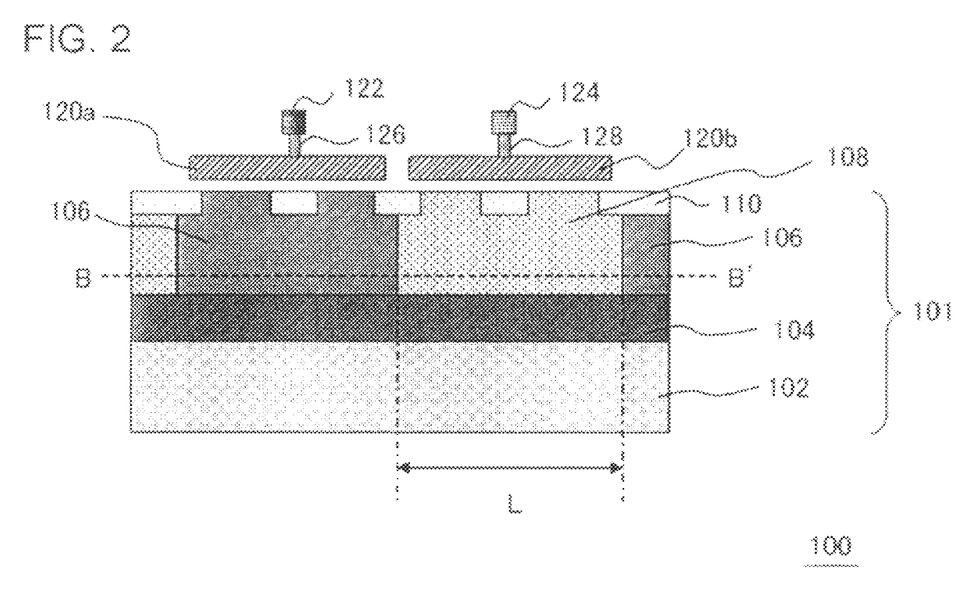
FIG. 2 is a sectional view along an A-A' line in FIG. 1.
Figure 3:
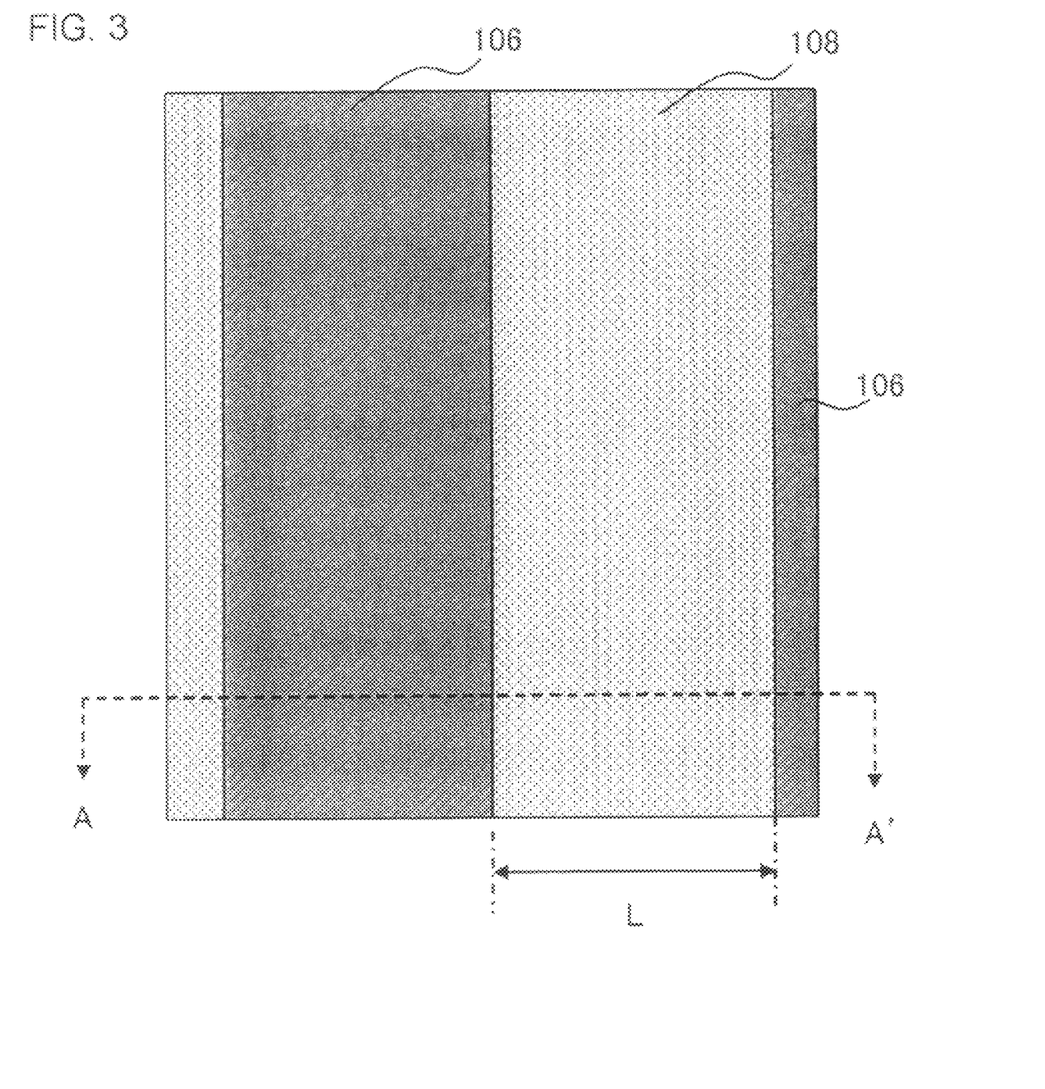
FIG. 3 is a plan view of a semiconductor device cut along a B-B' line in FIG. 2.

FIG. 1 is a plan view showing a configuration of a semiconductor device according to the embodiment. FIG. 2 is an A-A' sectional view in FIG. 1. FIG. 3 is a plan view of a semiconductor device 100 cut along a B-B' line in FIG. 2.

As shown in FIG. 2, the semiconductor device 100 includes a substrate structure 101 including a P-type substrate 102 (substrate), a buried P well 104 (buried well of a first conductivity type) formed on the P-type substrate 102, a plurality of P wells 106 (wells of the first conductivity type) and a plurality of N wells 108 (wells of a second conductivity type) which are formed on the buried P well 104 and alternately arranged adjacent to each other, and an element isolation insulating film 110 formed on the P wells 106 and surfaces of the N wells 108. The semiconductor device 100 includes a gate 120a (first gate electrode) and a gate 120b (second gate electrode) formed on the P wells 106 and the N wells 108 on the substrate structure 101, respectively, and a metal 122 and a metal 124 formed on the gates 120a and 120b through contacts 126 and 128, respectively.

An impurity concentration of the buried P well 104 is made to be higher than an impurity concentration of the P-type substrate 102. An impurity concentration of the P well 106 is made to be higher than an impurity concentration of the buried P well 104. Depths of the P well 106 and the N well 108 may be set to, for example, about 0.1 µm. A depth of the buried P well 104 may be set to, for example, about 1 µm.

In this case, a ground voltage is applied to the metal 122, and a power supply voltage is applied to the metal 124. With this configuration, the ground voltage is applied from the metal 122 to the gate 120a through the contact 126. For this reason, the ground voltage is also applied to the P wells 106 and the buried P well 104. The power supply voltage is applied from the metal 124 to the gate 120b through the contact 128. For this reason, the power supply voltage is also applied to the N wells 108. In this manner, a decoupling capacitor is formed between the N wells 108 and the buried P well 104. The decoupling capacitor of the semiconductor device 100 in the embodiment may be appropriately formed in a region in which a Meta-Oxide-Semiconductor (MOS) capacitor is formed.

In the embodiment, when the P-type substrate 102 has the same conductivity type as that of the buried P well 104, a ground voltage is applied from the rear surface of the substrate structure 101 to make it possible to supply the ground voltage to the buried P well 104. For example, when the semiconductor device 100 is to be packaged, the ground voltage is applied to a substrate of a semiconductor package such as a motherboard to make it possible to supply the ground voltage to the substrate structure 101 from the rear surface thereof.

In the embodiment, a width L of a region where the N well 108 is in contact with the buried P well 104 may be set to be equal to or less than 2 µm. In this case, the width L, as shown in FIG. 3, indicates a width perpendicular to an extending direction of the P wells 106 and the N wells 108 which are formed in parallel to each other. In this manner, as will be described below, a resistance between the N well 108 and the buried P well 104 can be reduced over the entire surface of the N well 108, and a capacitor which is applicable to a high frequency can be obtained. The width of the N well 108 may be equal to or more than, for example, 5 µm. In this manner, the decoupling capacitor between the N wells 108 and the buried P well 104 can be made sufficiently large.

Figure 4:
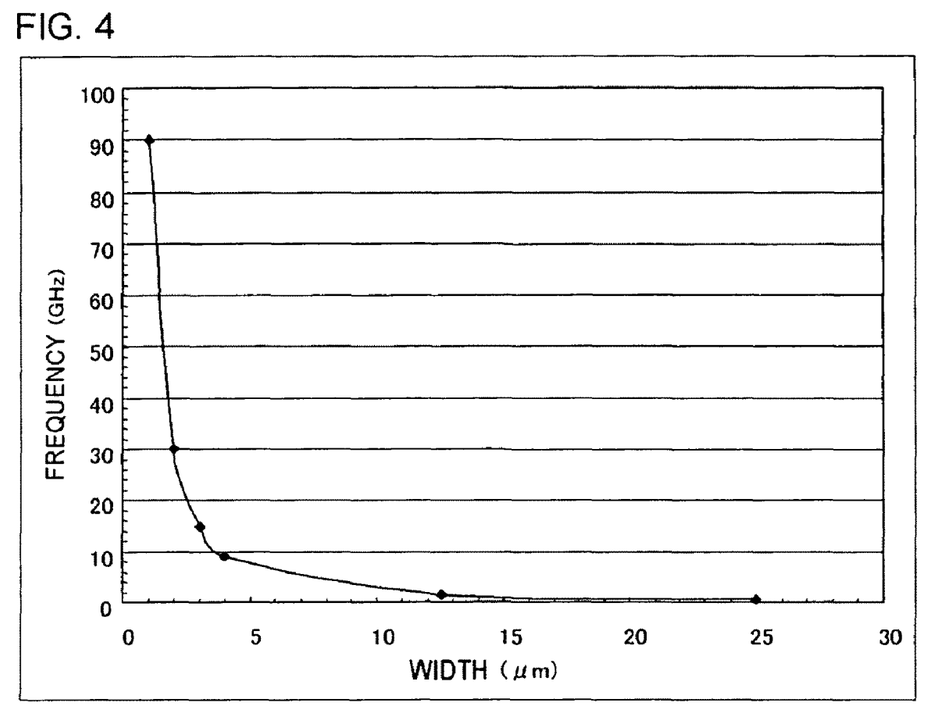
FIG. 4 is a graph showing a relationship between a width of an N well and a frequency to which a capacitor is applicable.

FIG. 4 is a graph showing a simulation result of a relationship between the width L of the N well 108 and a boundary frequency to which the capacitor is not applicable.

In this simulation, a frequency at which a parasitic resistance caused by a resistor R of the N wells 108 cannot be neglected with reference to an impedance $Z=1/(j\omega C)=1/(2\pi fCj)$ of the capacitor is determined as "the boundary frequency to which the capacitor is not applicable". As shown in FIG. 4, when the width of the N well 108 is equal to or less than 2 µm, the capacitor is applicable to a high frequency between about 20 and 30 GHz.

Figure 5:
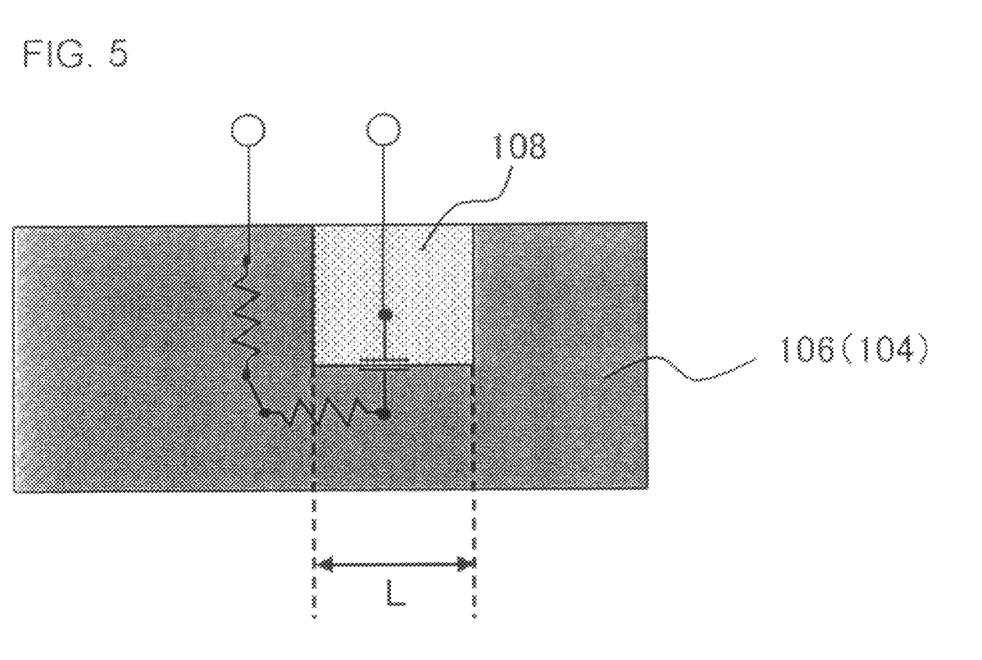
FIG. 5 is a sectional view showing a state in which a decoupling capacitor is formed between an N well and a P well of the semiconductor device according to the embodiment of the present invention.

FIG. 5 is a sectional view showing a state in which a decoupling capacitor is formed between the N well 108 of the semiconductor device 10 and the P well 106 according to the embodiment.

As shown in FIG. 5, by setting the width L of the N well 108 narrow, it is possible to reduce the resistance between the N well 108 and the buried P well 104 and the P well 106, and a capacitor which is applicable to a high frequency can be obtained.

Figure 6:
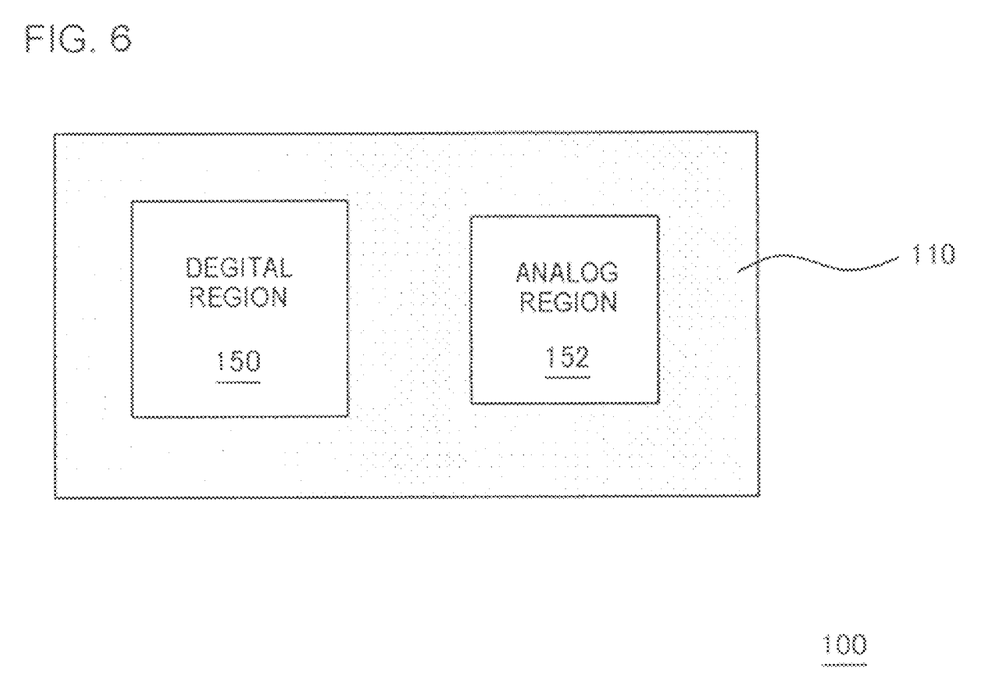
FIG. 6 is a plan view showing a digital region and an analog region formed on the semiconductor device according to the embodiment of the present invention.

FIG. 6 is a plan view showing an example in which a digital region 150 and an analog region 152 which are insulated from each other by the element isolation insulating film 110 are formed on the substrate structure 101 of the semiconductor device 100. In this embodiment, the semiconductor device 100 may have such the configuration. In this case, the coupling capacitors may be formed in both the digital region 150 and the analog region 152, or may be formed in any one of the digital region 150 and the analog region 152. The digital region 150 and the analog region 152 are isolated from each other as described above so that the decoupling capacitors can be independently formed in the digital region having a large amount of noise and the analog region being weak against noise. In this manner, the analog region can be prevented from being influenced by noise of the digital region, and a circuit in the analog region can be more reliably prevented from being erroneously operated.

According to the semiconductor device 100 of the embodiment, the resistance between the N well 108 and the buried P well 104 can be reduced over the entire area of the N well 108, and thereby a capacitor which is applicable to a high frequency can be obtained.

The embodiment of the present invention has been described above with reference to the accompanying drawings. However, the embodiment is an illustration of the present invention, and various configurations other than the above configuration can also be employed.

In the embodiment described above, the width of the P well 106 may be equal to the width of the N well 108, or may be different from the width of the N well 108.

It is apparent that the present invention is not limited to the above embodiment, and may be modified and changed without departing from the scope and spirit of the invention.

What is claimed is:

1. A semiconductor device comprising:
   a semiconductor substrate;
   a buried well comprising a first conductivity type formed on the semiconductor substrate; and
   a plurality of wells comprising the first conductivity type and a plurality of wells comprising a second conductivity type which are formed on the buried well of the first conductivity type and alternatively arranged adjacent to each other,
   wherein a width of a region where each of the wells of the second conductivity type is in contact with the buried well of the first conductivity type is not more than 2 μm,
   wherein a ground voltage and a power supply voltage are applied to the wells of the first conductivity type and the wells of the second conductivity type, respectively, and
   wherein a decoupling capacitor is formed between the wells of the second conductivity type and the buried well of the first conductivity type.

2. The semiconductor device according to claim 1, wherein the semiconductor substrate comprises the first conductivity type.

3. The semiconductor device according to claim 1, further comprising:
   a first gate electrode and a second gate electrode which are formed on a well of the wells of the first conductivity type and a well of the wells of the second conductivity type, respectively,
   wherein the ground voltage and the power supply voltage are applied to the first gate electrode and the second gate electrode, respectively, and the ground voltage and the power supply voltage are applied to the well of the first conductivity type and the well of the second conductivity type through the first gate electrode and the second gate electrode, respectively.

4. The semiconductor device according to claim 1,
   wherein a digital region and an analog region which are insulated from each other are formed on the semiconductor substrate, and
   the decoupling capacitor is formed in any one of the digital region and the analog region.

5. The semiconductor device according to claim 1,
   wherein the first conductivity type comprises a P type, and the second conductivity type comprises an N type.

6. The semiconductor device according to claim 2, wherein the buried well has an impurity concentration greater than an impurity concentration of the semiconductor substrate.

7. The semiconductor device according to claim 1, wherein the region where each of the wells of the second conductivity type is in contact with the buried well is perpendicular to another region where each of the wells of the second type is in contact with the buried well, and
   wherein the another region has a width that is greater than or equal to 5 μm.

8. The semiconductor device according to claim 4, wherein the decoupling capacitor comprises a first decoupling capacitor formed in the digital region and a second decoupling capacitor formed in the analog region, and
   the first decoupling capacitor and the second decoupling capacitor are independently formed.

9. The semiconductor device according to claim 1, wherein the buried well has an impurity concentration that is less than an impurity concentration of a well of the plurality of wells of the first conductivity type.

10. A semiconductor device comprising:
    a semiconductor substrate comprising a first conductivity type;
    a semiconductor layer formed on the substrate, the layer comprising the first conductivity type and having an impurity concentration greater than an impurity concentration of the semiconductor substrate;
    first wells comprising the first conductivity type; and
    second wells comprising a second conductivity type, the first and second wells being formed on the semiconductor layer and positioned adjacent one another in an alternating pattern,
    wherein each of the second wells has a width of 2 μm or less in a region bordering the semiconductor layer,
    wherein a ground voltage and a power supply voltage are applied to the first wells and the second wells, respectively, and
    wherein a decoupling capacitor is formed between the second wells and the layer.

11. The semiconductor device according to claim 10, further comprising:
    a first gate electrode and a second gate electrode formed on a well of the first wells and a well of the second wells, respectively,
    wherein the ground voltage and the power supply voltage are applied to the first gate electrode and the second gate electrode, respectively, and the ground voltage and the power supply voltage are applied to the well of the first wells and the well of the second wells through the first gate electrode and the second gate electrode, respectively.

12. The semiconductor device according to claim 10, wherein a digital region and an analog region which are insulated from each other are formed on the semiconductor substrate, and
    the decoupling capacitor is formed in any one of the digital region and the analog region.

13. The semiconductor device according to claim 10, wherein the first conductivity type comprises a P type, and
    the second conductivity type comprises an N type.

14. The semiconductor device according to claim 10, wherein the semiconductor region is perpendicular to another region bordering the semiconductor layer, and
    wherein the another region has a width that is greater than or equal to 5 μm.

15. The semiconductor device according to claim 10, wherein the decoupling capacitor is applicable to a high frequency being between approximately 20 GHz and 30 GHz.

16. A semiconductor device, comprising:
    a semiconductor substrate comprising a first conductivity type;
    a semiconductor layer of the first conductivity type formed on the substrate;
    first wells comprising the first conductivity type; and
    second wells comprising a second conductivity type, the first and second wells being formed on the semiconductor layer and positioned adjacent one another in an alternating pattern,
    wherein each of the second wells has a width of 2 μm or less in a region bordering the semiconductor layer,
    wherein a ground voltage and a power supply voltage are applied to the first wells and the second wells, respectively, and
    wherein a decoupling capacitor is formed between the second wells and the layer.

17. The semiconductor device according to claim 16, further comprising:
    a first gate electrode and a second gate electrode formed on a well of the first wells and a well of the second wells, respectively, wherein the ground voltage and the power supply voltage are applied to the first gate electrode and the second gate electrode, respectively, and the ground voltage and the power supply voltage are applied to the well of the first wells and the well of the second wells through the first gate electrode and the second gate electrode, respectively.

18. The semiconductor device according to claim 16, wherein a digital region and an analog region which are insulated from each other are formed on the semiconductor substrate, and
the decoupling capacitor is formed in any one of the digital region and the analog region.

19. The semiconductor device according to claim 16, wherein the first conductivity type comprises a P type, and
the second conductivity type comprises an N type.

20. The semiconductor device according to claim 16, wherein the semiconductor region is perpendicular to another region bordering the semiconductor layer, and
wherein the another region has a width that is greater than or equal to 5 µm.

21. The semiconductor device according to claim 16, wherein the decoupling capacitor is applicable to a high frequency being between approximately 20 GHz and 30 GHz.

22. A semiconductor device, comprising:
a semiconductor substrate;
a semiconductor layer formed on the substrate, the layer comprising a first conductivity type;
first wells comprising the first conductivity type; and
second wells comprising a second conductivity type, the first and second wells being formed on the semiconductor layer and positioned adjacent one another in an alternating pattern,
wherein each of the second wells has a width of 2 µm or less in a region bordering the semiconductor layer,
wherein a ground voltage and a power supply voltage are applied to the first wells and the second wells, respectively, and
wherein a decoupling capacitor is formed between the second wells and the layer.

23. The semiconductor device according to claim 22, wherein the semiconductor substrate comprises the first conductivity type, and
the semiconductor layer has an impurity concentration greater than an impurity concentration of the substrate.

24. The semiconductor device according to claim 23, further comprising:
a first gate electrode and a second gate electrode formed on a well of the first wells and a well of the second wells, respectively,
wherein the ground voltage and the power supply voltage are applied to the first gate electrode and the second gate electrode, respectively, and the ground voltage and the power supply voltage are applied to the well of the first wells and the well of the second wells through the first gate electrode and the second gate electrode, respectively.

25. The semiconductor device according to claim 23, wherein a digital region and an analog region which are insulated from each other are formed on the semiconductor substrate, and
the decoupling capacitor is formed in any one of the digital region and the analog region.

26. The semiconductor device according to claim 23, wherein the first conductivity type comprises a P type, and
the second conductivity type comprises an N type.

27. The semiconductor device according to claim 23, wherein the semiconductor region is perpendicular to another region bordering the semiconductor layer, and
wherein the another region has a width that is greater than or equal to 5 µm.

28. The semiconductor device according to claim 23, wherein the decoupling capacitor is applicable to a high frequency being between approximately 20 GHz and 30 GHz.

* * * * *